United States Patent
Goto et al.

(10) Patent No.: US 10,974,988 B2
(45) Date of Patent: Apr. 13, 2021

(54) GLASS TUBE FOR METAL SEALING AND GLASS FOR METAL SEALING

(71) Applicant: NIPPON ELECTRIC GLASS CO., LTD., Otsu (JP)

(72) Inventors: Tatsuya Goto, Otsu (JP); Kakumi Shiraishi, Otsu (JP); Kiyoyuki Okunaga, Otsu (JP); Koichi Hashimoto, Otsu (JP)

(73) Assignee: NIPPON ELECTRIC GLASS CO., LTD., Otsu (JP)

(*) Notice: Subject to any disclaimer, the term of this patent is extended or adjusted under 35 U.S.C. 154(b) by 70 days.

(21) Appl. No.: 16/096,703

(22) PCT Filed: Apr. 13, 2017

(86) PCT No.: PCT/JP2017/015200
§ 371 (c)(1),
(2) Date: Oct. 26, 2018

(87) PCT Pub. No.: WO2017/188015
PCT Pub. Date: Nov. 2, 2017

(65) Prior Publication Data
US 2019/0152837 A1    May 23, 2019

(30) Foreign Application Priority Data

Apr. 28, 2016 (JP) .............. JP2016-091170
Mar. 7, 2017 (JP) .............. JP2017-042907

(51) Int. Cl.
| | |
|---|---|
| *C03C 3/091* | (2006.01) |
| *C03C 3/087* | (2006.01) |
| *H01L 23/04* | (2006.01) |
| *C03C 3/085* | (2006.01) |
| *H01R 9/16* | (2006.01) |
| *C03C 27/02* | (2006.01) |
| *H01L 23/10* | (2006.01) |

(52) U.S. Cl.
CPC .............. *C03C 3/091* (2013.01); *C03C 3/085* (2013.01); *C03C 3/087* (2013.01); *C03C 27/02* (2013.01); *H01L 23/04* (2013.01); *H01R 9/16* (2013.01); *C03C 2201/80* (2013.01); *H01L 23/10* (2013.01)

(58) Field of Classification Search
CPC ............ C03C 3/091; C03C 3/87; C03C 27/02
See application file for complete search history.

(56) References Cited

U.S. PATENT DOCUMENTS

| | | | |
|---|---|---|---|
| 2004/0163415 | A1 | 8/2004 | Hashimoto et al. |
| 2008/0128923 | A1 | 6/2008 | Saito et al. |

FOREIGN PATENT DOCUMENTS

| | | |
|---|---|---|
| JP | H04-4577 A | 1/1992 |
| JP | 2000-7374 A | 1/2000 |
| JP | 2003-17632 A | 1/2003 |
| JP | A-2003-040643 | 2/2003 |
| JP | 2005-276640 A | 10/2005 |
| JP | 2005-353291 A | 12/2005 |
| JP | B2-3775734 | 3/2006 |
| JP | 2014-141397 A | 8/2014 |
| WO | WO-2006/035882 A1 | 4/2006 |

OTHER PUBLICATIONS

Machine Translation of JP 2003-017632 A, Espacenet, 2003 (Year: 2003).*
International Search Report dated Jul. 4, 2017 for PCT/JP2017/015200.
International Search Report/Written Opinion dated Jul. 4, 2017 for PCT/JP2017/015200 [non-English language].
Extended European Search Report dated Oct. 30, 2019 in corresponding European patent application 17789301.3 (41 pages).
EP Office Action dated Feb. 12, 2021 from corresponding European patent application No. 17789301.3 (4 pages).

* cited by examiner

*Primary Examiner* — Elizabeth A. Bolden
(74) *Attorney, Agent, or Firm* — Faegre Drinker Biddle & Reath LLP

(57) ABSTRACT

A glass tube for sealing a metal includes a glass that contains, in terms of mass %, 50% or more of $SiO_2+B_2O_3$, 0% to 10% of $Al_2O_3$, 3% to 20% of RO (R is an alkaline earth metal), and 11% to 22% of $R'_2O$ (R' is an alkali metal), and that has 10 μl/g or less of an amount of $CO_2$ emitted when heated from a room temperature to 1100° C.

10 Claims, No Drawings

GLASS TUBE FOR METAL SEALING AND GLASS FOR METAL SEALING

TECHNICAL FIELD

The present invention relates to a glass tube for sealing a metal, used in an airtight terminal or the like.

BACKGROUND ART

The airtight terminal has a configuration in which a lead terminal penetrates through an annular outer peripheral metal and is sealed with a glass layer (see, for example, Patent Document 1). The airtight terminal is not only used as an insulation terminal for a mere wiring, but also used as a package which can protect electrical/electronic parts, semiconductor devices, or the like from various environmental conditions by putting a cover thereon so as to air-tightly seal the above parts completely after mounting of the above parts.

Such an airtight terminal can be, for example, prepared by: incorporating a lead terminal into an outer peripheral metal by inserting the lead terminal into a glass tube; thermal treating the incorporated one to carry out sealing integration; and thereafter polishing the lead terminal at an end surface, the outer peripheral metal and the glass.

CITATION LIST

Patent Document

Patent Document 1: JP-A-2005-353291

SUMMARY OF THE INVENTION

Problems to be Solved by the Invention

A glass tube used for producing an airtight terminal is required to have an average coefficient of linear expansion matched with the outer peripheral metal and the lead terminal, to have no bubble generated at the time of sealing, or the like.

However, an existing glass tube may react with the lead terminal or the like, to generate bubbles at the time of sealing. When the bubbles are generated, there is a possibility that the airtightness becomes poor, and the glass tube is peeled off from an interface with the lead terminal or the like.

An object of the present invention is to provide a glass tube for sealing a metal in which bubbles are difficult to generate at the time of sealing.

Means for Solving the Problem

As a result of various studies, the present inventors have confirmed that gas contained in glass causes bubbles, and the present invention is proposed.

That is, a glass tube for sealing a metal according to the present invention is characterized by including a glass that contains, in terms of mass %, 50% or more of $SiO_2+B_2O_3$, 0% to 10% of $Al_2O_3$, 3% to 20% of RO (R is an alkaline earth metal), and 11% to 22% of $R'_2O$ (R' is an alkali metal), and that has 10 µl/g or less of an amount of $CO_2$ emitted when heated from a room temperature to 1100° C. Herein, "$SiO_2+B_2O_3$" means the total content of $SiO_2$ and $B_2O_3$. "7% to 20% of RO (R is an alkaline earth metal)" means that the total content of alkaline earth metal oxides is 7% to 20%. "11% to 22% of $R'_2O$ (R' is an alkali metal)" means that the total content of alkali metal oxides is 11% to 22%. An "amount of $CO_2$ emitted when heated from a room temperature to 1100° C." means the emission amount of $CO_2$ measured by a gas analysis apparatus. The gas analysis apparatus includes a container made of quartz, and a mass analyzer. The measurement sample is a residue on a sieve having a mesh size of 300 µm, the residue being glass pieces ground in a mortar and passed through a sieve having a mesh size of 1000 µm. The amount of $CO_2$ emitted is measured as follows. First, the sample is set into a container made of quartz and heated at a constant ratio to generate gas from the sample. Further, the gas generated by the sample is conveyed by carrier gas to a mass analyzer, and the $CO_2$ gas is detected by the mass analyzer. In this way, the amount of the detected $CO_2$ gas is converted into the amount of gas emitted per gram sample weight in terms of µL assumed under the standard state (0° C. and 1 atm).

According to the glass tube for sealing a metal of the present invention having the above configuration, an average coefficient of linear expansion matched with a metal such as SUS is easily obtained, and the suitable viscosity property can be adjusted for sealing. Further, since the amount of the $CO_2$ gas dissolved in the glass is few, the bubble generation at the time of sealing can be effectively suppressed.

It is preferable that the glass tube of the present invention includes the glass containing the total content of $SiO_2$, $B_2O_3$, $Al_2O_3$, RO and $R'_2O$ of 97 mass % or more.

According to the above configuration, since the glass can substantially contain no lead, the burden on the environment can be reduced.

It is preferable that the glass tube according to the present invention includes the glass containing, in terms of mass %, 50% to 75% of $SiO_2$, 0% to 10% of $B_2O_3$, 0% to 10% of $Al_2O_3$, 0% to 10% of MgO, 0% to 10% of CaO, 0% to 10% of SrO, 0% to 15% of BaO, 0% to 5% of $Li_2O$, 0% to 15% of $Na_2O$, and 0% to 10% of $K_2O$, and particularly the glass containing, in terms of mass %, 69% to 74% of $SiO_2$, 0.1% to 3% of $B_2O_3$, 2% to 6% of $Al_2O_3$, 0% to 10% of MgO, 0% to 10% of CaO, 0.1% to 4% of SrO, 1% to 8% of BaO, 0% to 4% of ZnO, 2% to 4% of $Li_2O$, 3% to 6% of $Na_2O$, 7% to 11% of $K_2O$, and 0.05% to 2% of $Sb_2O_3$.

According to the glass having the above configuration, an average coefficient of linear expansion matched with a metal such as SUS is easily obtained, and the suitable viscosity property can be adjusted for sealing. Further, since the content of divalent ions contained in the glass such as alkaline earth metal ions having a large ion radius is few, defects can be difficult to occur at the time of polishing after sealing. In addition, the volume resistivity is high.

It is preferable that the glass tube of the present invention includes the glass containing 4.5 mass % to 8 mass % of BaO.

In polishing process for finishing an airtight terminal, when the defect or crack occurs in the glass, the insulation property of the airtight terminal deteriorates. However, if the above configuration is adopted, occurrence of the defect or crack can be easily suppressed, in particular.

It is preferable that the glass tube of the present invention includes the glass having an average coefficient of linear expansion at 30° C. to 380° C. of $85 \times 10^{-7}$/° C. to $105 \times 10^{-7}$/° C. The "average coefficient of linear expansion" is a value calculated from an elongation amount of a columnar sample at a temperature range of 30° C. to 380° C., the temperature range being obtained by processing the glass into a columnar sample of 5 mmΦ×50 mm, thereafter maintaining the columnar sample in an electric furnace of a pushing rod type thermal expansion measuring apparatus (dilatometer), and heating the columnar sample at a temperature elevation rate of 3° C./min.

According to the above configuration, since the average coefficient of linear expansion is matched a metal such as SUS, reduction of sealing strength or the like caused by mismatching of expansion is hard to occur.

A glass for sealing a metal according to the present invention is characterized by comprising, in terms of mass %, 69% to 74% of $SiO_2$, 0.1% to 3% of $B_2O_3$, 2% to 6% of $Al_2O_3$, 0% to 10% of MgO, 0% to 10% of CaO, 0.1% to 4% of SrO, 1% to 8% of BaO, 0% to 4% of ZnO, 2% to 4% of $Li_2O$, 3% to 6% of $Na_2O$, 7% to 11% of $K_2O$, and 0.05% to 2% of $Sb_2O_3$.

It is preferable that the glass for sealing a metal of the present invention contains 4.5 mass % to 8 mass % of BaO.

It is preferable that the glass for sealing a metal of the present invention has a value of the temperature tk 100, showing a volume resistivity of $10^8$ Ω·cm, of 300° C. or higher, based on DIN (Deutsche Industrie Normen) 52326.

It is preferable that the glass for sealing a metal of the present invention has an average coefficient of linear expansion at 30° C. to 380° C. of $85 \times 10^{-7}$/° C. to $105 \times 10^{-7}$/° C.

DESCRIPTION OF EMBODIMENTS

A glass tube for sealing a metal and a glass for sealing a metal suitable for preparing the glass tube according to the present invention are described in detail.

A glass constituting a glass tube for sealing a metal according to the present invention includes a glass that contains 50% or more of $SiO_2+B_2O_3$, 0% to 10% of $Al_2O_3$, 3% to 20% of RO (R is an alkaline earth metal), and 11% to 22% of $R'_2O$ (R' is an alkali metal). The reasons for limiting the glass composition as above are as follows. Incidentally, "%" means "mass %" unless otherwise indicated particularly.

$SiO_2$ and $B_2O_3$ are components for forming a network structure of the glass. It is preferably that the content of the $SiO_2$ and $B_2O_3$ is 50% or more, 60% to 75%, and particularly 65% to 75%. When the content of the $SiO_2$ and $B_2O_3$ is too low, the fragility of the glass is large, and the glass is difficult to form a tube shape. In addition, when the content of the $SiO_2$ and $B_2O_3$ is too high, the glass is difficult to melt.

It is preferably that the content of the $SiO_2$ is 50% to 75%, 60% to 75%, 68% to 73%, 69% to 74%, and particularly 70% to 73%. When the content of the $SiO_2$ is too low, the fragility of the glass is large, and the glass tube is hard to form a tube shape. When the content of the $SiO_2$ is too high, the glass is difficult to melt.

It is preferably that the content of the $B_2O_3$ is 0% to 10%, 0% to 7%, 0.1% to 3%, and particularly 0.5% to 2%. Since when the content of the $B_2O_3$ is low, the meltability during production tends to be low and the productivity tends to deteriorate, it is preferable to contain the $B_2O_3$ as an essential component. When the content of the $B_2O_3$ is too high, the phase separation ability becomes strong and the glass is easily to be unstable.

$Al_2O_3$ is a component for improving chemical durability of the glass. It is preferably that the content of the $Al_2O_3$ is 0% to 10%, 2% to 7%, 3% to 6%, and particularly 3% to 5%. Since when the content of the $Al_2O_3$ is low, the chemical durability tends to deteriorate and the surface tends to alter during storage and processing, it is preferable to contain the $Al_2O_3$ as an essential component. When the content of the $Al_2O_3$ is too high, the softening point is increased and the sealing temperature is increased.

MgO, CaO, SrO, and BaO are components for adjusting the softening temperature or expansion of the glass. Of these, SrO or BaO has an effect for improving the weather resistance of the glass. It is preferably that the total content of the MgO, CaO, SrO, and BaO is 3% to 20%, 3% to 15%, 4% to 10%, and particularly 5% to 10%. When the total content of these components is too high, vitrification becomes difficult.

It is preferably that the content of the MgO is 0% to 10%, 0% to 5%, and particularly 0% to 3%. When the content of the MgO is too high, devitrification becomes strong and formation becomes difficult.

It is preferably that the content of the CaO is 0% to 10%, and particularly 0% to 2.5%. When the content of the CaO is too high, devitrification becomes strong and formation becomes difficult.

It is preferably that the content of the SrO is 0% to 10%, 0% to 5%, 0% to 3%, 0.1% to 4%, and particularly 0.5% to 3%. Since when the content of the SrO is low, the weather resistance tends to deteriorate, it is preferable to contain the SrO as an essential component. When the content of the SrO is too high, devitrification becomes strong and formation becomes difficult. In addition, defects are easy to occur at the time of polishing after sealing.

It is preferably that the content of the BaO is 0% to 15%, 1% to 15%, 3% to 15%, 4.5% to 10%, 4.5% to 8%, and particularly 5% to 7%. Since when the content of the BaO is low, the weather resistance tends to deteriorate, it is preferable to contain the BaO as an essential component. When the content of the BaO is too high, devitrification becomes strong and formation becomes difficult. In addition, defects are hard to occur at the time of polishing after sealing.

$Li_2O$, $Na_2O$ and $K_2O$ are components for lowering the softening point of the glass and increasing expansion. It is preferably that the total content of the $Li_2O$, $Na_2O$ and $K_2O$ is 11% to 22%, 11% to 20%, 13% to 18%, and particularly 15% to 17%. When the content of R'20 is too low, the softening point is increased and sealing at a low temperature becomes difficult. When the content of $R'_2O$ is too high, the expansion increases too much, the expansion is difficult to be matched with SUS or the like, and the sealing strength is lowered.

It is preferably that the content of the $Li_2O$ is 0% to 10%, 2% to 5%, 2% to 4%, and particularly 2.5% to 3.5%. Since when the content of the $Li_2O$ is low, the softening point is increased and the expansion is reduced, it tends to be difficult to seal the metal. Therefore, it is preferable to contain the $Li_2O$ as an essential component. When the content of the $Li_2O$ is too high, the expansion increases and it is difficult to seal the metal. In addition, since the fragility of the glass becomes large, it becomes difficult to form the tube. Further, the volume resistivity of the glass is lowered.

It is preferably that the content of the $Na_2O$ is 0% to 15%, 2% to 7%, 3% to 6%, and particularly 3.5% to 5.5%. Since when the content of the $Na_2O$ is low, the softening point is increased and the expansion is reduced, it tends to be difficult to seal the metal. Therefore, it is preferable to contain the $Na_2O$ as an essential component. When the content of the $Na_2O$ is too high, the expansion increases and it is difficult to seal the metal. In addition, since he fragility of the glass becomes large, it becomes difficult to form the tube. Further, the volume resistivity of the glass is lowered.

It is preferably that the content of the $K_2O$ is 0% to 15%, 1% to 13%, 7% to 12%, 7% to 11%, and particularly 8% to 10%. Since when the content of the $K_2O$ is low, the softening point is increased, and the expansion is reduced, it tends to be difficult to seal the metal. Therefore, it is preferable to contain the $K_2O$ as an essential component. When the content of the $K_2O$ is too high, the expansion increases and it becomes difficult to form the tube since the fragility of the glass becomes large.

It is preferable that the glass according to the present invention has a total content of the $SiO_2$, $B_2O_3$, $Al_2O_3$, MgO, CaO, SrO, BaO, $Li_2O$, $Na_2O$, and $K_2O$ of 97% or more, 98% or more, and particularly 99% or more. When the total content of these components is too low, it is difficult to obtain the desired properties.

In addition to the above components, a component such as a fining agent and a colorant may be contained within a range not impairing the necessary properties. The fining agent can be contained in the total content of $Sb_2O_3$, $SnO_2$, $CeO_2$, etc., of up to 2%, and particularly up to 1%. It is preferable to use $Sb_2O_3$ as the fining agent, and in this case, it is preferable that the content is 0.05% to 2%. As the colorant, $Fe_2O_3$, $Co_2O_3$, Nib, CuO, etc., can be added. However, since these colorants may facilitate bubble generation caused by the reaction between the glass and the lead terminal, it is preferable that the total content thereof is 1% or less and particularly 0.2% or less. It is preferable to contain no colorant if possible.

It is preferable that the glass according to the present invention has an average coefficient of linear expansion at 30° C. to 380° C. of $85 \times 10^{-7}$/° C. to $105 \times 10^{-7}$/° C., $90 \times 10^{-7}$/° C. to $100 \times 10^{-7}$/° C., $90 \times 10^{-7}$/° C. to $98 \times 10^{-7}$/° C., and particularly $93 \times 10^{-7}$/° C. to $98 \times 10^{-7}$/° C. When the average coefficient of linear expansion is beyond the above ranges, the expansion is difficult to be matched with SUS or the like, and the sealing strength is lowered.

It is preferable that the glass according to the present invention has a softening point of 800° C. or lower, 750° C. or lower, 600° C. to 700° C., and particularly 635° C. to 695° C. When the softening point is too high, sealing at a low temperature becomes difficult.

The glass according to the present invention has 10 μl/g or less of an amount of $CO_2$ emitted when heated from room temperature to 1100° C. In addition, a preferable range of the amount of $CO_2$ emitted is 10 μl/g or less, and particularly 8 μl/g or less. When the amount of $CO_2$ emitted is too much, the glass easily reacts with the lead terminal or the like to generate bubbles when preparing the airtight terminal or the like. As a method for reducing the amount of $CO_2$ emitted from the glass, a method for lengthening a melting time of the glass and reducing a usage amount of a carbonate raw material (for example, replacing a part of the carbonate raw material by a nitrate raw material) or the like may be adopted.

It is preferable that the glass according to the present invention has a value of the temperature tk 100, showing a volume resistivity of $10^8$ Ω·cm, of 300° C. or higher, and particularly 305° C. or higher, based on DIN 52326. When the value of tk 100 is low, the insulation is easily to be poor.

Next, a method for producing the glass tube for sealing a metal according to the present invention is described.

First, raw materials for the glass are mixed so as to obtain the desired composition, and a raw material batch is prepared. In mixing the raw materials for the glass, it is preferable that a part of the carbonate raw material is replaced by the nitrate raw material. Incidentally, in the case of being replaced by the nitrate raw material, it is preferable to use strontium nitrate, sodium nitrate, potassium nitrate, etc., which are easy to handle.

Next, the raw material batch for the glass is charged into a furnace for melting the glass, and the raw materials are melt, vitrified, stirred, and mixed to obtain a homogeneously molten glass. When melting the raw materials, it is preferable to select the type and size of the furnace for melting the glass, and to adjust the flow rate of the glass, so as to lengthen the melting time.

Subsequently, the molten glass is formed as a tube shape and is cut into a given length. As a method for forming the glass as a tube shape, for example, a Danner method, a redraw method, a down-draw method, a blowing method, or the like may be adopted.

Thereafter, end surface processing or the like is carried out as needed, and thereby the glass tube for sealing a metal of the present invention can be obtained.

In order to cause the $CO_2$ emission amount to be lower than or equal to a given value, before actual production and/or during actual production, the $CO_2$ emission amount of the produced glass tube may be measured, and the raw materials for the glass and the melting time may be adjusted based on the obtained value.

Next, an example of the method for sealing a metal using the glass tube for sealing a metal according to the present invention is described. First, a metal member made of SUS or the like is inserted into the glass tube for sealing a metal of the present invention. Subsequently, thermal treatment is carried out in a given temperature, and a metal pin is sealed and fixed into the glass tube. Incidentally, in order to prevent the metal member from being oxidized, it is preferable to introduce a nitrogen gas or a mixed gas of nitrogen and hydrogen during the thermal treatment.

EXAMPLES

Hereinafter, the present invention is described based on working examples. However, the following description is exemplified, and the present invention is not limited thereto.

Example 1

Table 1 shows samples (Samples Nos. 1 to 7).

TABLE 1

| Glass composition | 1 | 2 | 3 | 4 | 5 | 6 | 7 |
|---|---|---|---|---|---|---|---|
| $SiO_2$ | 70 | 70 | 63 | 70 | 59 | 70 | 70 |
| $B_2O_3$ | 3 | 3 | 2 | — | — | 3 | 3 |
| $Al_2O_3$ | 3 | 3 | 5 | 2 | 3 | 3 | 3 |
| CaO | — | — | 1 | — | — | — | — |
| SrO | 1 | 1 | 1 | — | 9 | 1 | 1 |
| BaO | 6 | 6 | 12 | 14 | 8 | 6 | 6 |
| $Li_2O$ | 10 | 10 | 1 | — | — | 10 | 10 |
| $Na_2O$ | 4 | 4 | 7 | 14 | 10 | 4 | 4 |
| $K_2O$ | 3 | 3 | 8 | — | 11 | 3 | 3 |
| $Fe_2O_3$ | — | — | — | — | — | — | 2 |
| Melting time (hr) | 16 | 16 | 36 | 36 | 36 | 3 | 16 |
| Use of nitrate raw material | No | Yes | No | No | No | No | No |
| Softening point (° C.) | 660 | 660 | 670 | 660 | 700 | 660 | 660 |
| Average coefficient of linear expansion ($\times 10^{-7}$/° C.) | 95 | 95 | 97 | 95 | 110 | 95 | 95 |

TABLE 1-continued

| Glass composition | 1 | 2 | 3 | 4 | 5 | 6 | 7 |
|---|---|---|---|---|---|---|---|
| $CO_2$ emission amount | 8 | 6 | 8 | 7 | 7 | 14 | 11 |
| Bubble | No | No | No | No | No | Yes | Yes |

Each sample is prepared as follows.

First, raw materials for the glass were mixed so as to obtain the composition in the table, and a raw material batch was prepared. As a SrO source, Sample No. 2 used a nitrate raw material (strontium nitrate), and other samples used strontium carbonate. Next, the raw material batch was put into a platinum crucible and melted at 1500° C. The melting time was the time as shown in the table. Subsequently, the molten glass was poured out to form a plate shape for various evaluations. The results were shown in Table 1.

As was evident from Table 1, it was recognized that Samples Nos. 1 to 5 whose $CO_2$ emission amount was 10 μl/g or less had no bubbles generated on an interface with the pin. On the other hand, it was recognized that Samples Nos. 6 and 7 whose $CO_2$ emission amount was larger than 10 μl/g had bubbles generated. In particular, Sample No. 7 containing $Fe_2O_3$ had bubbles generated remarkably.

Incidentally, the softening point was measured by a fiber elongation method in accordance with ASTM-C338.

The average coefficient of linear expansion was measured using a pushing rod type thermal expansion measuring apparatus (dilatometer).

The $CO_2$ gas emission amount was measured using a gas analysis apparatus.

The bubble generation property was evaluated as follows.

First, disk-shaped samples were prepared from the glass taken during melting, and were cut to a width of 5 mm. Next, the cut samples were wiped at surfaces thereof using an alcohol, thereafter charged into ion exchange water, and ultrasonically washed.

Subsequently, pins for evaluation were put on a carbon plate, on which the washed samples were placed. Further, in this state, the samples were charged into an electric furnace, and were thermally treated by elevating temperature to 800° C. at a rate of 20° C./min, and maintaining this temperature for 25 minutes. Incidentally, in the thermal treatment, the nitrogen gas was supplied into the electric furnace at a rate of 1 L per minute.

Further, the samples were taken out of the electric furnace after the electric furnace was cooled to 400° C., the interfaces between the glass and the pins were observed using a stereomicroscope, and whether there were bubbles generated was evaluated.

Example 2

Table 2 shows samples (Samples Nos. 8 to 15).

TABLE 2

| Glass composition | 8 | 9 | 10 | 11 | 12 | 13 | 14 | 15 |
|---|---|---|---|---|---|---|---|---|
| $SiO_2$ | 71.7 | 72.9 | 70.9 | 71.9 | 66.1 | 63.5 | 61.1 | 66.5 |
| $Al_2O_3$ | 3.8 | 2.0 | 3.0 | 3.5 | 3.5 | 1.7 | 4.3 | 4.0 |
| $B_2O_3$ | 0.8 | 1.0 | 2.0 | 1.0 | | 2.2 | | |
| SrO | 1.0 | 1.0 | 2.1 | 1.0 | | | 0.2 | 0.2 |
| BaO | 6.2 | 6.0 | 3.2 | 6.0 | 14.4 | 17.2 | 17.7 | 13.0 |
| ZnO | — | — | 1.7 | | | | | |
| $Li_2O$ | 3.0 | 2.9 | 2.7 | 2.9 | 0.6 | | | |
| $Na_2O$ | 4.0 | 4.2 | 5.5 | 4.2 | 7.4 | 7.0 | 7.7 | 7.0 |
| $K_2O$ | 9.2 | 9.7 | 8.6 | 9.2 | 7.4 | 8.4 | 8.6 | 9.0 |
| $Sb_2O_3$ | 0.3 | 0.3 | 0.3 | 0.3 | 0.4 | | 0.3 | 0.2 |
| CoO | | | | | 0.2 | | 0.1 | 0.1 |
| Defect test | ○ | ○ | ○ | ○ | x | x | x | x |
| tk 100 [° C.] | 309 | 326 | 324 | 311 | 275 | 290 | 288 | 286 |
| Average coefficient of linear expansion [×10⁻⁷/° C.] | 93 | 96 | 95 | 94 | 93 | 96 | 97 | 94 |
| Softening point [° C.] | 665 | 653 | 657 | 659 | 677 | 686 | 659 | 678 |

Each sample is prepared as follows.

First, raw materials for the glass were mixed so as to obtain the composition in the table, and a raw material batch was prepared. Next, the raw material batch was put into a platinum crucible and melted at 1500° C. The melting time was the time as shown in the table. Subsequently, the molten glass was poured out to form a plate shape for various evaluations. The results were shown in Table 2.

As was evident from Table 2, Samples Nos. 8 to 11 had good results for defect tests and the tk 100 was 300° C. or higher.

In the defect tests, the glass which was shaped into a tube was provided between a metal pin and a flat metal washer, the thermal treatment was carried out at 1000° C., and a metal body sealed by the glass was prepared. Subsequently, the metal body sealed by the glass was provided on a polisher using alumina powder as an abrasive, and the polishing operation was performed under a condition of 100 rpm. The defects generated in the glass after polishing were observed using a microscope. A case where the number of the defects of 0.1 mm or more is 0 to 5 was evaluated as "○", and a case where the number of the defects of 0.1 mm or more is 6 or more was evaluated as "x".

The tk 100 was a temperature showing that the volume resistivity of the glass was $10^8$ Ω·cm, and was measured in accordance with DIN 52326.

INDUSTRIAL APPLICABILITY

The glass tube for sealing a metal of the present invention can be used for various uses, such as a transistor, a stem for IC, a wind cap for semiconductor, a rectifier element, a stem for thyristor, a pressure sensor stem, and other insulation terminals.

The invention claimed is:

1. A glass tube for sealing a metal, comprising a glass that contains, in terms of mass %, 50% or more of $SiO_2+B_2O_3$, 0% to 10% of $Al_2O_3$, 3% to 20% of RO (R is an alkaline earth metal), and 11% to 22% of $R'_2O$ (R' is an alkali metal), 0% to 3% of SrO, and 1% or less of $Fe_2O_3$, and that has 10 μl/g or less of an amount of $CO_2$ emitted when heated from a room temperature to 1100° C.

2. The glass tube for sealing a metal according to claim 1, wherein the glass contains 4.5 mass % to 8 mass % of BaO.

3. The glass tube for sealing a metal according to claim 1, wherein the glass contains the total content of $SiO_2$, $B_2O_3$, $Al_2O_3$, RO and $R'_2O$ of 97 mass % or more.

4. The glass tube for sealing a metal according to claim 1, wherein the glass contains, in terms of mass %, 50% to 75% of $SiO_2$, 0% to 10% of $B_2O_3$, 0% to 10% of $Al_2O_3$, 0% to 10% of MgO, 0% to 10% of CaO, 0% to 3% of SrO, 0% to 15% of BaO, 0% to 5% of $Li_2O$, 0% to 15% of $Na_2O$, and 0% to 10% of $K_2O$.

5. The glass tube for sealing a metal according to claim 1, wherein the glass contains, in terms of mass %, 69% to 74% of $SiO_2$, 0.1% to 3% of $B_2O_3$, 2% to 6% of $Al_2O_3$, 0% to 10% of MgO, 0% to 10% of CaO, 0.1% to 3% of SrO, 1% to 8% of BaO, 0% to 4% of ZnO, 2% to 4% of $Li_2O$, 3% to 6% of $Na_2O$, 7% to 11% of $K_2O$, and 0.05% to 2% of $Sb_2O_3$.

6. The glass tube for sealing a metal according to claim 1, wherein the glass has an average coefficient of linear expansion at 30° C. to 380° C. of $85 \times 10^{-7}$/° C. to $105 \times 10^{-7}$/° C.

7. A glass for sealing a metal, comprising, in terms of mass %, 69% to 74% of $SiO_2$, 0.1% to 3% of $B_2O_3$, 2% to 6% of $Al_2O_3$, 0% to 10% of MgO, 0% to 10% of CaO, 0.1% to 3% of SrO, 1% to 8% of BaO, 0% to 4% of ZnO, 2% to 4% of $Li_2O$, 3% to 6% of $Na_2O$, 7% to 11% of $K_2O$, and 0.05% to 2% of $Sb_2O_3$, and 1% or less of $Fe_2O_3$.

8. The glass for sealing a metal according to claim 7, containing 4.5 mass % to 8 mass % of BaO.

9. The glass for sealing a metal according to claim 7, the glass having a temperature when the volume resistivity is $10^8$ Ω·cm (tk 100) of 300° C. or higher, based on DIN 52326.

10. The glass for sealing a metal according to claim 7, having an average coefficient of linear expansion at 30° C. to 380° C. of $85 \times 10^{-7}$/° C. to $105 \times 10^{-7}$/° C.

* * * * *